United States Patent
Simondin

(10) Patent No.: US 8,466,751 B2
(45) Date of Patent: Jun. 18, 2013

(54) HIGH-PRECISION AND LOW-CONSUMPTION QUARTZ OSCILLATOR

(75) Inventor: Jean-Pierre Simondin, Cholet (FR)

(73) Assignee: Thales, Neuilly sur Seine (FR)

( * ) Notice: Subject to any disclaimer, the term of this patent is extended or adjusted under 35 U.S.C. 154(b) by 99 days.

(21) Appl. No.: 13/058,614

(22) PCT Filed: Aug. 6, 2009

(86) PCT No.: PCT/EP2009/060148
§ 371 (c)(1),
(2), (4) Date: May 2, 2011

(87) PCT Pub. No.: WO2010/018111
PCT Pub. Date: Feb. 18, 2010

(65) Prior Publication Data
US 2012/0126902 A1    May 24, 2012

(30) Foreign Application Priority Data

Aug. 14, 2008 (FR) ..................................... 08 04604

(51) Int. Cl.
*H03L 7/00* (2006.01)
*H03L 1/02* (2006.01)
*H03B 5/32* (2006.01)

(52) U.S. Cl.
USPC ................. 331/44; 331/18; 331/47; 331/158; 331/176

(58) Field of Classification Search
USPC ............. 331/18, 44, 46–49, 55, 56, 154, 158, 331/176
See application file for complete search history.

(56) References Cited

U.S. PATENT DOCUMENTS

| | | | |
|---|---|---|---|
| 4,513,259 A * | 4/1985 | Frerking | 331/176 |
| 5,767,747 A * | 6/1998 | Pricer | 331/46 |
| 7,982,549 B1* | 7/2011 | Husted et al. | 331/175 |
| 2003/0095008 A1 | 5/2003 | Kranz | |

FOREIGN PATENT DOCUMENTS

EP    1585223 A1    10/2005

* cited by examiner

*Primary Examiner* — Levi Gannon
(74) *Attorney, Agent, or Firm* — Baker & Hostetler, LLP

(57) ABSTRACT

A precise, low-consumption low-frequency oscillator includes a low-consumption low-frequency oscillator, operating at a frequency $F_A$, a temperature-compensated oscillator B used as frequency standard, operating at a frequency $F_B$, and a circuit for supplying a stable frequency Fcorr.

9 Claims, 3 Drawing Sheets

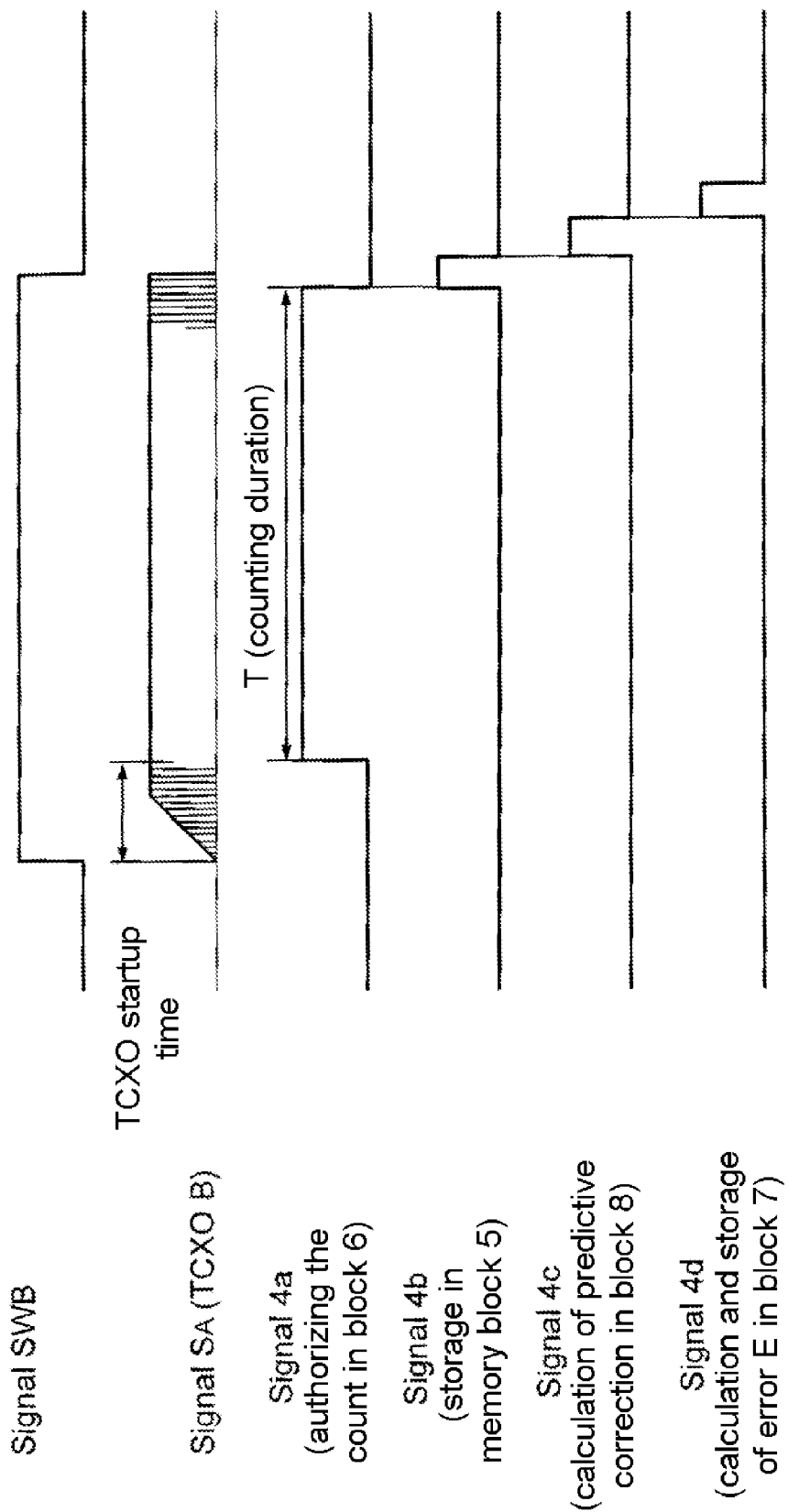

HIGH-PRECISION AND LOW-CONSUMPTION QUARTZ OSCILLATOR

CROSS-REFERENCE TO RELATED APPLICATIONS

This application is a National Stage of International patent application PCT/EP2009/060148, filed on Aug. 5, 2009, which claims priority to foreign French patent application No. FR 08 04604, filed on Aug. 14, 2008, the disclosures of which are incorporated by reference in their entirety.

FIELD OF THE INVENTION

The subject of the invention relates to a low-consumption quartz oscillator capable of supplying a signal that is stable over time from a low-power digital oscillator and from a temperature-compensated quartz oscillator of TCXO type that is temperature corrected and has a higher consumption. It is notably used to retain the time in equipment operating, on standby or when shut down, in contexts in which the power source is low, for example, for low-power cell batteries.

BACKGROUND OF THE INVENTION

The retention of time in standalone digital radiocommunication equipment is usually handled by a quartz oscillator, the output of which, generally after a divider, regularly increments a counter. The time can be deduced from this counter. The precision of the time supplied should observe criteria linked in particular to the bit rate of the radiocommunications and to the inactivity time between communications. Also, the pulses produced by the oscillator after division may be used to drive sequencers managing the state of the radio equipment, in particular when the equipment is shut down or when the latter is on standby, or even provoke processor interrupts. These pulses have to observe phase jitter constraints.

Producing such a device presupposes finding the most satisfactory trade-off between a number of conflicting objectives, namely:

research and fabrication costs that are as low as possible,
operation at a low voltage which should observe a low consumption to enable the time to be retained on an integrated energy source (cell battery or accumulator battery) over a duration that may exceed a year in certain cases,
maintenance of time precision in the short, medium and sometimes long term that is sufficient to maintain the operational functionalities of the equipment, notably its capacity to communicate after a period of inactivity. This last constraint should take into account the variation of the operating conditions of the device: power supply voltage which decreases over time, temperature which may vary between defined limits, speed of variation of this temperature.

A first solution proposed by the prior art relates to the production of a precise and low-consumption clock based on the use of a quartz oscillator with moderate frequency, below 10 MHz, operating at low power, followed by a divider. The relatively high variations of such an oscillator as a function of temperature are compensated by a learning-based calibration with a sufficient number of temperatures and a storage of parameters in a non-volatile memory. The correction is handled by a processor circuit which is periodically placed in service to read the non-volatile memory, to generate an analog voltage which is applied to a varicap diode which then adjusts the frequency of the oscillator as a function of the stored value. The variations of the oscillator as a function of temperature are sufficiently low for a fairly slow correction rate (for example every 10 seconds) to be sufficient to tolerate fairly rapid temperature variations, for example 3° C./min. The design of such an oscillator is difficult and the production cost is high. Also, the consumption still remains relatively high because of the high quartz frequency and proves difficult to bring below 400 microamperes. One of the drawbacks of this prior art is that it uses a quartz oscillator operating at low power, and requires a specific, difficult and costly design, with a relatively high consumption.

In order to reduce the consumption, one solution consists in reducing the frequency of the oscillator to a value corresponding to that generally used in watches, that is to say 32 768 KHz. The natural stability of the oscillator is then significantly less good and its compensation by calibration as a function of temperature is more difficult. The desired precision is not generally achieved, for example 2 ppm in a wide temperature range that may vary between −40° C. and +85° C.

Another solution consists in employing two oscillators:

a high frequency oscillator, above 10 MHz, with high precision, temperature-compensated, with limited aging, but relatively high consumption; such a component is known by the abbreviation TCXO (Temperature-Compensated Crystal Oscillator); its cost is relatively low. This oscillator is the main clock of the equipment and it is used in operation to pace the processors; it is not powered when the equipment is on standby or shut down.

a low-frequency oscillator, generally of the order of 32 768 KHz, imprecise, not temperature-compensated, with higher aging, but very low consumption and very low cost; this oscillator is kept operating on standby and sometimes when shut down.

The drawbacks created by the use of the low-frequency oscillator are generally compensated by one or more of the following solutions:

calibration of the low-frequency oscillator in the factory as a function of temperature and storage of the error in a non-volatile memory (error measured during calibration); periodic application of the correction on standby or when shut down,
automatic calibration of the low-frequency oscillator relative to the high-frequency oscillator when the equipment is in operation and storage of the error in a non-volatile memory,
automatic calibration of the low-frequency oscillator during communications with a base station and storage of the error in a non-volatile memory,
inclusion of typical parameters of the low-frequency oscillator: probable aging, variation as a function of power supply voltage.

In the case where two oscillators are used, the solution is not generally designed for generation of a permanent precise compensated clock, independent of the rest of the equipment. In the case where the clock is physically generated, the switching between the two oscillators produces an uncertainty as to its phase, an uncertainty which may be incompatible with the desired time precision and the specified jitter.

European patent application EP 1585223 describes a method and a system for determining a calibration factor between a fast clock signal and high accuracy, and a slower clock signal. EP 1585223 proposes to apply the clock signal slower (20 to 100 kHz) with a variable order divider, which rank is stable and is adjusted periodically even if it does not work, after rapid counting the clock signal for a period of the slower clock signal. This process does not achieve an important point, because of the low count time and the variation in frequency between each division rank. It is referred to a precision better than 5%.

The solutions proposed by the prior art are therefore either too costly, too energy-intensive for a system operating on a cell battery or that has a low power or energy autonomy, or insufficiently precise in frequency or phase.

SUMMARY OF THE INVENTION

The present invention remedies at least the abovementioned problems, provides, e.g., 2 ppm or 0.0002% (or better) precision, and uses a low-frequency oscillator A whose particular feature is permanent low consumption, the frequency FA of which is chosen to be a multiple of the frequency of the desired signal, said oscillator is coupled to a temperature-compensated quartz oscillator whose frequency is of the order of 10 to 30 MHz, which exhibits a high stability. Other devices that exhibits characteristics comparable to those of a temperature-compensated quartz oscillator which has a high stability may also be used.

The temperature-compensated TCXO oscillator is periodically powered up to measure the error of the low-frequency oscillator A. A correction logic circuit according to the invention is used notably to digitally compensate the error by a variable-rank divider and digitally anticipate the regular frequency variations. This makes it possible to achieve the maintenance of a stable clock on standby or when shut down.

The invention relates to a precise, low-consumption low-frequency oscillator, characterized in that it comprises, in combination, at least the following elements:
  a low-consumption low-frequency oscillator A, operating at a frequency $F_A$,
  a temperature-compensated quartz TCXO oscillator B used as frequency standard, operating at a frequency $F_B$,
  a digital circuit suitable for supplying a stable frequency Fcor comprising at least:
    an input receiving a power supply signal,
    an input permanently receiving a signal $S_A$ from the oscillator A,
    an input receiving the signal $S_B$ from the oscillator B during calibration, produced at a rate $R_1$, when a switch is activated by a sequencer managing all the components that form the circuit,
    a counter counting the number of pulses emitted by the TCXO oscillator B during a given period, so as to represent the error between the oscillators A and B,
    a memory storing the number $N_B$ from the counter, and the numbers $N_{B-1}$, $N_{B-2}$, $N_{B-3}$, ... $N_{B-n}$ of pulses emitted by the oscillator B and counted by the counter during preceding periods,
    a module designed to analyze the results of the count $N_B$ at a given moment and those of the previously stored counts $N_{B-n}$, and deduce therefrom a correction to be applied to the count $N_B$,
    an adder receiving the values from the counter and from the correction calculation module, and the output of which delivers a number representing a corrected error E which is stored,
    an accumulator, comprising a predefined threshold value M; when the value of the accumulator, taken as an absolute value, exceeds the predefined maximum value M, said accumulator delivers, to a variable-rank divider, on the one hand an overshoot indicator and on the other hand the sign of this overshoot; in the case of an overshoot, the maximum value M is subtracted from, or added to, the accumulator to cancel the overshoot,
    a variable-rank divider having a nominal value K; in the event of an overshoot of the value of the accumulator, the division rank K is modified to K+1 or K−1 according to the sign of the value of the error contained in said accumulator, during a period of the output signal Scorr, said variable-rank divider producing the desired and corrected signal Scorr.

The oscillator A is, for example, an oscillator operating at a frequency $F_A$, the value of which is chosen such that said oscillator has a low consumption, a precision and a temperature stability that are controlled. This frequency value is, for example, substantially equal to 32 768 Hz.

The TCXO oscillator B is an oscillator operating at a frequency $F_B$ chosen such that said oscillator has a low consumption, a small footprint and a low cost price, such as a frequency value within the range 10 to 30 MHz.

The circuit may be a component fabricated in CMOS technology or any other low-consumption technology in the form of an ASIC, a CPLD, an FPGA or a microprocessor.

The oscillator may be powered by a regulator positioned on the power supply voltage and a circuit consisting of a resistor R and a reservoir capacitor C located between the power supply and the regulator.

The oscillator according to the invention is notably used in the field of radiocommunications.

The invention also relates to a method for delivering a signal Scorr with a frequency that is stable over time from a low-consumption quartz oscillator A, emitting a signal $S_A$ at a frequency $F_A$, characterized in that it comprises at least the following steps:
  determining a first fixed rate $R_1$ for periodically measuring the frequency error of the oscillator A:
  step 1a: powering up a temperature-compensated TCXO oscillator B and waiting for it to stabilize,
  step 2a: counting periods or transitions of the signal $S_B$, emitted by the oscillator B (number of pulses emitted) during a duration T (counting duration) defined on the basis of the period of the signal $S_A$,
  step 3a: powering down the temperature-compensated quartz TCXO oscillator B, storing the number $N_B$ corresponding to the count of the step 2a, and updating the numbers $N_{B-1}$, $N_{B-2}$, $N_{B-3}$, ... $N_{B-n}$ of pulses emitted by the oscillator B and counted by the counter during preceding periods,
  step 4a: comparing the result of the count $N_B$ obtained during the duration T with that of the preceding measurements $N_{B-1}$, $N_{B-2}$, $N_{B-3}$, ... $N_{B-n}$, determining a polynomial variation law in order to estimate the correction to be applied to $N_B$, to finally obtain the probable average error E for the next period of the rate $R_1$ and storing this value E,
  determining a second rate $R_2$ and executing the following steps:
  step 1b: adding the stored average error E to an accumulator at the rate $R_2$,
  step 2b: when the value of the accumulator, taken as an absolute value, exceeds a predefined maximum value M, then transmitting to a variable-rank divider, having a nominal value K, on the one hand an overshoot indicator and on the other hand the sign of this overshoot and executing the following operations:

modifying the division rank K to K+1 or K−1 depending on the sign of the value of the error contained in the accumulator, during a period of the output signal Scorr, subtracting from, or adding to, the accumulator the maximum value M to cancel the overshoot.

According to one embodiment, the rate $R_2$ is determined on the basis of the acceptable maximum error equal as an absolute value to the threshold value of the accumulator M and of the amplitude of the time correction applied to each overshoot of the accumulator.

BRIEF DESCRIPTION OF THE DRAWINGS

Other features and advantages of the device according to the invention will become more apparent from reading the following description of an illustrative and in no way limiting exemplary embodiment with appended figures which represent:

FIG. 3, the steps implemented to measure the frequency error.

DETAILED DESCRIPTION

Figure 1:
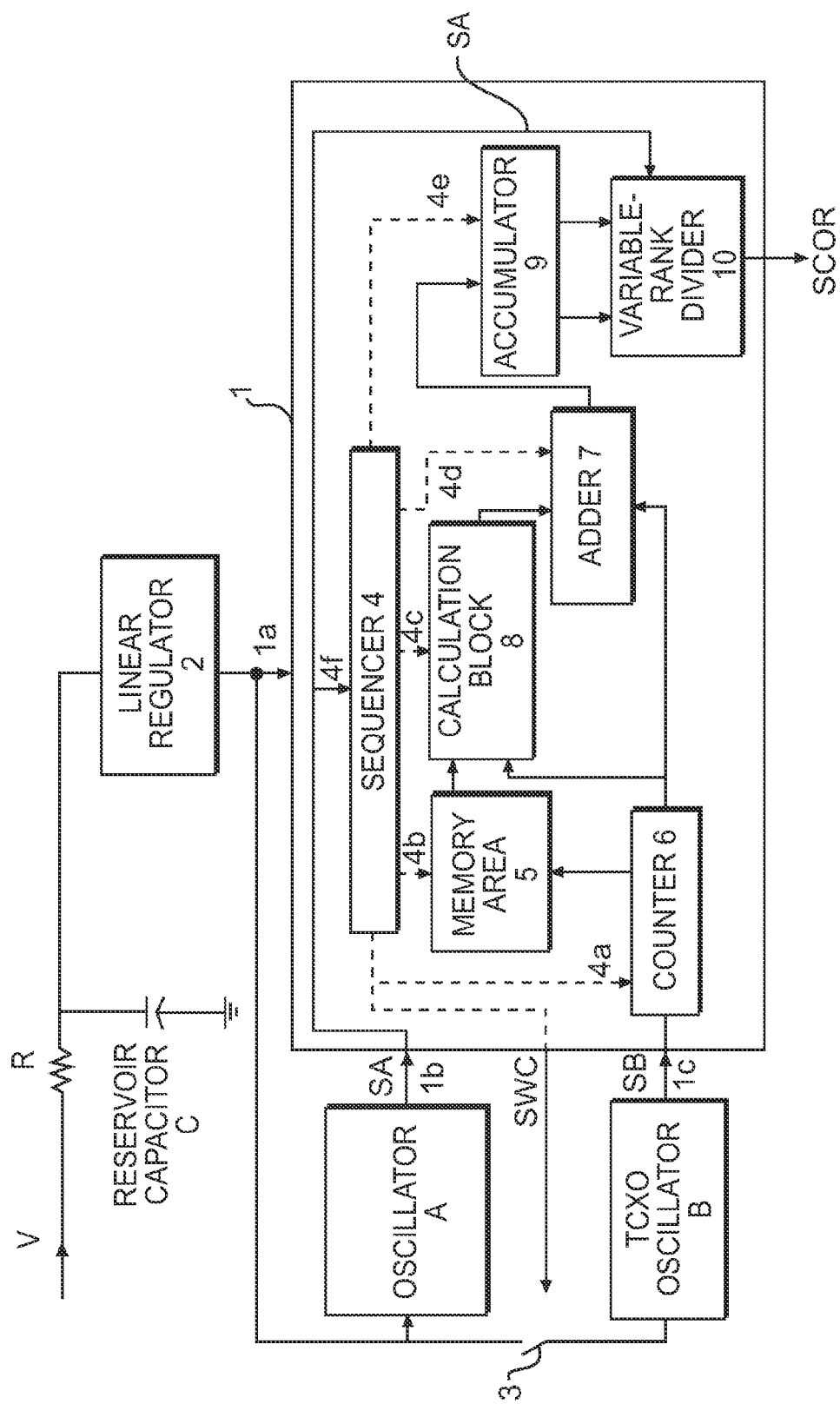
FIG. 1, an exemplary architecture according to the invention comprising the abovementioned two oscillators and the digital error compensation circuit.

FIG. 1 represents an exemplary architecture of a precise, low-consumption, low-frequency oscillator according to the invention. In order to give a better understanding of the subject of the present invention, the example is given for an output frequency of the low-frequency oscillator that is typically between 1024 Hz and a few Hz, and its required stability of the order of 2 ppm over one year within the −40° to 85° C. temperature range and in the presence of maximum temperature variations of approximately 3° C. per minute. The required consumption may be of the order of 100 µA with inrush currents less than 1 mA.

A power supply symbolized by the letter V powers a digital circuit 1 and also a first low-frequency quartz oscillator A and a TCXO-type oscillator B.

The frequency of the oscillator A is typically of the order of 32 768 Hz, a frequency used in watchmaking and in the time retention circuits of electronic equipment (Real Time Clock). The oscillator A is the source of the desired output signal, by division. This signal will never be switched to the TCXO oscillator B, in order to preserve a continuous phase during transitions from the standby or shutdown modes or normal operating mode. The oscillator B is powered for a short period, at a regular rate. The TCXO oscillator B operates at a frequency that is typically between, for example, 10 and 30 MHz. Its startup and that of the associated circuits (described below) lead to a not-inconsiderable consumption of the order of a few mA. Obtaining a low average consumption, typically 100 µA, presupposes enabling the TCXO for a small part of the time. For example, for a calibration of the oscillator A to 0.1 ppm, the in-service time of the TCXO will be approximately 0.5 seconds, which leads to an enabling period of the order of one minute. During this relatively long time interval, the temperature may vary substantially and modify the frequency of the oscillator A. Oscillators operating at 32 768 Hz usually have a mediocre precision (for example +/−20 ppm at ambient temperature) and above all strong variations as a function of temperature (parabolic variation reaching −160 ppm at −40° C. and +90° C. which is reflected in a slope of 4.5 ppm/° C. For an objective of resistance to temperature variations of 3° C./min, it is thus possible to achieve a frequency variation FA of the oscillator A of 13.5 ppm/min with a standard oscillator operating at 32 768 Hz at the temperature of −40° C. This leads to the need to predictively compensate for the frequency variations, by virtue of including the preceding error measurements.

For the TCXO B, a frequency will be used that is as low as possible in order to limit the consumption, but that makes it possible to observe a low cost and obtain a good oscillator stability. All the circuits are powered at low voltage, for example 2.5 V, via a linear regulator 2 with low voltage drop in order to guarantee the maximum stability of the TCXO.

An architecture that makes it possible to obtain the performance levels stated above is described in FIG. 1. The two oscillators A and TCXO B are linked to a digital circuit or processor 1. The function of the processor is notably:

to regularly trigger operations to enable the TCXO B, and to measure the oscillator A relative to the TCXO B, by counting periods or pulses, to process the measurement result (storage, calculation of the probable error), to apply regular clock corrections according to this error.

The processor has a first input 1a which receives the power supply after passage into a regulator 2. A second input 1b receives the signal $S_A$ from the oscillator A at a frequency $F_A$. A third input 1c receives the signal $S_B$ from the TCXO oscillator at a frequency $F_B$. The oscillator B is periodically powered by virtue of a switch 3 actuated by a line linked to a sequencer 4. The function of the sequencer 4 is notably to manage the various steps implemented and to control the various components of the processor 1 and the two oscillators A and B. The outputs of the sequencer are a signal 4a enabling the counting in the counter 6, 4b storage in a memory area 5, 4c command to a calculation block 8, 4d calculation and storage of the error E in an adder, 4e to an accumulator 9. The sequencer also has an output for the signal SWB that actuates the switch 3. It receives at the input 4f the signal $S_A$ from the oscillator A.

The output of the counter 6 corresponds to the error measured before correction. A memory area 5 stores the latest values of the error calculated from the count $N_B$ of the signal $S_B$ performed in the counter 6, namely the number $N_B$ from the counter and the numbers $N_{B-1}$, $N_{B-2}$, $N_{B-3}$, ... $N_{B-n}$ measured previously.

From these stored values, the calculation block 8 determines the law followed by the error as a function of time, and deduces therefrom the probable correction to be applied to the latest measurement of the error (forecasting the average variation of the error) so as to provide an average-mode compensation for the frequency variations (and therefore temperature variations) in the next period between 2 operations to measure the oscillator A relative to the TCXO B.

This correction is added to the latest measurement of the error in the adder 7. At the output of the adder, the value obtained corresponds to the corrected error. The output of the adder 7 is stored and is added to an accumulator 9 at a rate $R_2$ defined by the sequencer 4. When the value of the accumulator 9 exceeds a predefined threshold value M, then the latter delivers, to a variable-rank divider 10 that has a nominal value K, on the one hand an overshoot indicator and on the other hand the sign of this overshoot. The variable-rank divider produces the desired and corrected signal Scor. The threshold value M is subtracted from, or added to, the accumulator, depending on the sign of the overshoot.

The processor or digital circuit 1 is a digital processor circuit with low static and dynamic consumption, which may be based, for example, on the CMOS (Complementary Metal Oxide Semiconductor) semiconductor technology, or any other technology with low consumption, in the form of an ASIC (Application-Specific Integrated Circuit), a programmable integrated circuit CPLD (Complex Programmable Logic Device), a microprocessor or any other equivalent device.

FIG. 1 also shows a reservoir capacitor C and an associated series resistor R, linked to the linear regulator 2. Their physical parameters are chosen notably to ensure:
- a peak voltage drop that is compatible with the available power supply voltage and the power supply voltage of the components,
- a cost, a footprint, variations within the climatic range and a residual consumption that are as low and small as possible.

Such an arrangement makes it possible to provide the inrush currents needed while enabling the TCXO and to limit the current taken from the energy source, for example, a lithium battery, through the series resistor R. The battery in this case is indirectly connected to the V level in FIG. 1. In certain application cases, other electronic circuits may be located between the battery and V.

Figure 2:
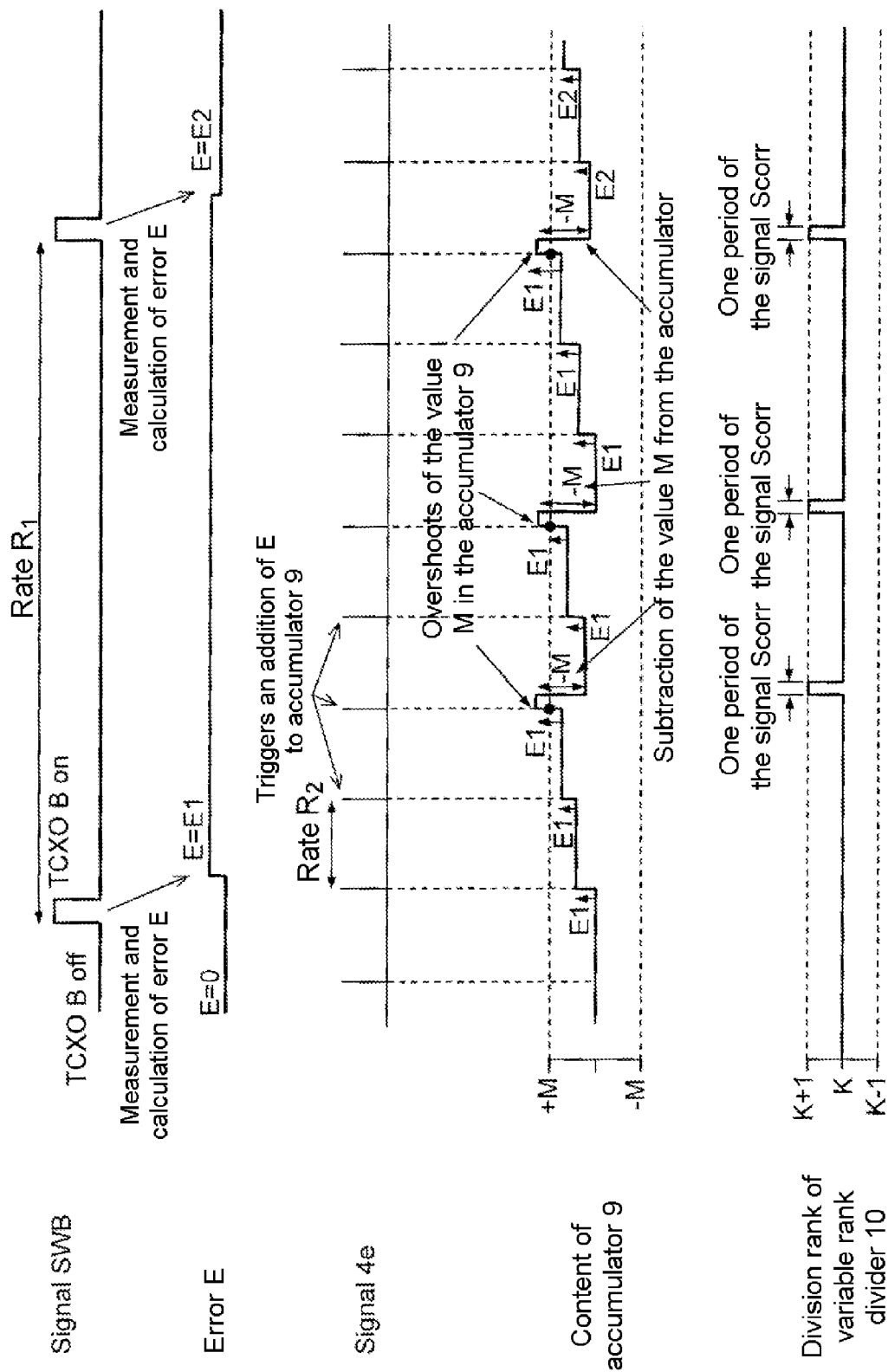
FIG. 2, a diagram of the general operation of the architecture of FIG. 1.

After having described an exemplary architecture in FIG. 1, FIGS. 2 and 3 will make it possible to follow the operation of such a system and the measurement of the frequency error. In the absence of any correction, the signal supplied by the processor 1 corresponds to the signal from the oscillator A at a frequency $F_A$ divided by the variable-rank divider 10 which has set its division factor to the nominal value K.

FIG. 2 diagrammatically represents a "timing diagram" in the chain of the sequences in the operation of the oscillator according to the invention and FIG. 3 shows a timing diagram of the signals for the error measurement.

The sequencer 4 determines a first fixed rate $R_1$ dependent on the potential drift of the oscillator A in temperature, the speed of variation of this temperature, and the quality of the compensation described hereinbelow. The measurement and the calculation of the error will be performed at this rate. For this, the processor, via the sequencer 4, will then execute the following operations:

Step 1a: powering up of the TCXO oscillator B and waiting for its operation to stabilize. The stabilization time is given by the TCXO B manufacturer. The stabilization time is, for example, of the order of 10 ms;

Step 2a: counting the periods or transitions of the signal $S_B$ (number of pulses emitted) during a duration T (counting duration) defined on the basis of the period of the signal $S_A$ (signal 4a enabling the counting in the block 6). A sufficient number of events must be counted to ensure the desired precision; for example, if a precision of $0.5 \cdot 10^{-7}$ is required, then $1/0.5 \cdot 10^{-7} = 2 \cdot 10^7$ events must be counted; if each event is a period of the signal B and the frequency of the TCXO B is 20 MHz, then the counting must continue for a duration of $T = 2 \cdot 10^7 / 20 \cdot 10^6 = 1$ second.

The counting is done by the binary counter 6 of limited capacity. The choice of the parameters (number of events, size of counter 6, digital correction of the result) is such that the result of this count (signed binary) is zero if the signals $S_A$ and $S_B$ are perfectly synchronous. The size of the counter 6 is determined according to the maximum error that may occur between the signal $S_A$ and the signal $S_B$. The maximum error Emax is equal to the sum of the maximum errors of each of the oscillators A and B, as a function of temperature, aging and power supply voltage variations; since the counter is binary, the power of 2 immediately above the maximum error calculated hereinabove is chosen; this value is named M hereinafter in the document.

Step 3a: powering down of the TCXO oscillator B. The signal 4b corresponds to the storage in the memory block 5. The memory stores the number $N_B$ and also the numbers $N_{B-1}$, $N_{B-2}$, $N_{B-3}$, ... $N_{B-n}$ measured previously, Step 4a: the result of the count $N_B$ obtained during the duration T is compared to that of the preceding measurements. A polynomial variation law (of a degree dependent on the number of preceding values stored) is calculated by the calculation block 8 (signal 4c), in order to estimate the correction to be applied to $N_B$, to finally obtain the average error E that is valid for the next period of the rate $R_1$. This result E is stored (signal 4d calculation and storage of the error E in the block 7).

Concurrently with these operations executed at a rate $R_1$, the sequencer determines a second fixed rate $R_2$ dependent on the maximum error to be corrected. The bottom part of FIG. 2 diagrammatically represents the steps and operations executed at this second rate.

Step 1b: the result preceding E is added to the accumulator 9 at the rate $R_2$ (see signal 4e, FIG. 2).

Step 2b: when the value of the accumulator 9, taken as an absolute value, exceeds the predefined maximum value M, then the processor 1 will execute the following operations:
- modify the division rank K to K+1 or K−1 depending on the sign of the value of the error contained in the accumulator, during a period of the output signal Scorr
- subtract from, or add to, the accumulator the maximum value M to cancel the overshoot, depending on the sign of the latter. This is equivalent to a zero reset: the application of the correction (change of division rank) must be accompanied by the discharging from the accumulator of the equivalent of this correction.

The rate $R_2$ (that is expressed as a duration in seconds) is determined from the acceptable maximum error, which is equal, as an absolute value, to M, expressed as a number of TCXO B counting events during the duration T, and the amplitude of the time correction applied to each overshoot of the accumulator, which depends on the frequency of the oscillator A. In practice, the change of division rank over a period of the signal Scorr (of average frequency $F_A$) modifies the duration of the period Scorr by more or less one period of the signal of the oscillator A.

An example is given to illustrate the abovementioned various operations and steps.

Example: $F_A = 32\ 768$ Hz, $F_B = 20$ MHz, counting of the periods during T=1 second, maximum oscillator error=200 ppm or $2 \cdot 10^{-4}$; the value of M should be greater than $20 \cdot 10^6 \times 2 \cdot 10^{-4} = 4000$, or in practice 4096 to take an integer power of 2; the maximum acceptable relative error of the device is therefore $4096/20 \cdot 10^6 = 2.048 \cdot 10^{-4}$; this relative error produces a maximum time error on each period $R_2$ of $R_2 \times 2.048 \cdot 10^{-4}$, an error that should be equal to the correction capacity calculated above, of one period of the signal A: $R_2 \times 2.048 \cdot 10^{-4} = 1/F_A$, which makes it possible to calculate $R_2 = 1/(32\ 768 \times 2.048 \cdot 10^{-4}) = 0.149$ s.

An example is given to better understand the meaning of the value of $R_1$ in the case of a linear prediction.

Determination of the rate $R_1$ (expressed as a duration in seconds)

Example: linear predictive correction (a single preceding value stored); slope of maximum frequency variation as a function of temperature=5 ppm/° C.; slope of temperature variation as a function of time=3° C./min; maximum acceptable time error when starting this temperature variation Δt=180 μs (or 0.1 ppm over 30 min). The frequency/time slope P is of 5 ppm/°C.×3°C./min=15 ppm/min or 2.5 10⁻⁷/s.

The predictive correction cannot avoid an error when starting up the frequency variation. In the worst case (start of variation just after a frequency measurement), there may be a frequency error that increases throughout a period $R_1$. It is shown that the corresponding time drift Δt at the end of a period $R_1$ is equal to $(R_1)^2 \times P/2$. During the following period $R_1$, the time error is precisely compensated by the predictive correction (2 successive values of the frequency are known, which make it possible to determine the slope P and correct it).

In the case indicated, the maximum value of $R_1$ is therefore:

$$R_1 \geq \sqrt{(2\Delta t/P)} = \sqrt{(2 \times 180\ 10-6/2.5\ 10-7)} = 37.9\ s$$

The system according to the invention notably offers the advantage of providing a low-frequency oscillator that has a high precision of the order of a few ppm and a low consumption approximately 10 times less than that of a conventional TCXO oscillator.

This low consumption is ensured by the use of a permanent low frequency quartz oscillator.

The temperature stability is ensured by the use of a calibration TCXO and the stability during the temperature variations is obtained by means of a predictive algorithm implemented in the abovementioned processor and its components.

The generation of a signal without phase breaks is ensured by the absence of switchovers between 2 oscillators. The consumption draws are reduced by the use of a reservoir capacitor. A low cost is ensured by the absence of temperature calibration and the use of commonplace components.

The invention claimed is:

1. A precise, low-consumption low-frequency oscillator, comprising:
    a low-consumption low-frequency oscillator A, operating at a frequency $F_A$, said oscillator A emitting a signal $S_A$,
    a temperature-compensated quartz (TCXO) oscillator B used as a frequency standard, operating at a frequency $F_B$, and
    a digital circuit suitable for supplying a stable frequency Fcor comprising at least:
        an input receiving a power supply signal,
        an input permanently receiving the signal $S_A$ from the oscillator A,
        an input receiving the signal $S_B$ from the TCXO oscillator B during calibration, produced at a rate $R_1$, when a switch is activated by a sequencer managing all the components that form a circuit formed by the low-consumption low-frequency oscillator,
        a counter counting a number of pulses emitted by the TCXO oscillator B during a given period, so as to represent an error between the oscillators A and B,
        a memory storing a number $N_B$ from the counter in the given period, and numbers $N_{B-1}, N_{B-2}, N_{B-3}, \ldots, N_{B-n}$ of pulses emitted by the TCXO oscillator B and counted by the counter during preceding periods,
        a module of calculation to estimate a correction for analyzing the number $N_B$ at a given moment and those of the numbers $N_{B-n}$, previously stored, and for deducing therefrom the correction to be applied to the number $N_B$,
        an adder receiving values from the counter and from the module of calculation, and an output of said adder delivers a number representing a corrected error E that is stored,
        an accumulator, where said corrected error E is added with a rate $R_2$ comprising a predefined threshold value M; when a value of the accumulator, taken as an absolute value, exceeds the predefined threshold value M, said accumulator delivers, to a variable-rank divider, an overshoot and a sign of the overshoot, such that when the overshoot exists, the predefined threshold value M is subtracted from, or added to, the accumulator to cancel the overshoot, and
        the variable-rank divider having a nominal value K; such that when the overshoot exists in the accumulator, the nominal value K is modified by K+1 or K−1 according to a sign of the corrected E contained in the accumulator, during a period of an output signal Scorr, said variable-rank divider produces a desired and corrected value of the output signal Scorr.

2. The oscillator as claimed in claim 1, wherein the oscillator A is an oscillator operating at the frequency $F_A$, a value of which frequency $F_A$ is chosen such that said oscillator has a consumption, a precision and a temperature stability that are controlled.

3. The oscillator as claimed in claim 2, wherein the value of the frequency $F_A$ is substantially equal to 32 768 Hz.

4. The oscillator as claimed in claim 1, wherein the TCXO oscillator B is an oscillator operating at the frequency $F_B$ chosen such that said TCXO oscillator B has a low consumption, a small footprint and a low cost price, the frequency $F_B$ value is within the range 10 to 30 MHz.

5. The oscillator as claimed in claim 1, wherein the circuit is a component fabricated in Complementary Metal Oxide Semiconductor (CMOS) technology or a low-consumption technology in the form of an Application-Specific Integrated Circuit (ASIC), a Complex Programmable Logic Device (CPLD), an FPGA or a microprocessor.

6. The oscillator as claimed in claim 1, further comprising a regulator positioned on a power supply voltage and a circuit consisting of a resistor R and a reservoir capacitor C located between a power supply providing the power supply voltage and the regulator.

7. The use of an oscillator as claimed in claim 1, for radiocommunications.

8. A method for delivering a stable-frequency signal Scorr from a low-consumption quartz oscillator A, emitting a signal $S_A$ at a frequency $F_A$, said method comprising:
    determining a first fixed rate $R_1$ for periodically measuring a frequency error of the low-consumption quartz oscillator A;
    step 1a: powering up a temperature-compensated (TCXO) oscillator B and waiting for the TCXO oscillator B to stabilize;
    step 2a: counting in a counter's periods or transitions of a signal $S_B$, emitted by the TCXO oscillator B as a number of pulses emitted during a duration T or a counting duration defined based on a period of the signal $S_A$;
    step 3a: powering down the TCXO oscillator B, storing a number $N_B$ corresponding to the number of pulses of the step 2a, and updating numbers $N_{B-1}, N_{B-2}, N_{B-3}, \ldots, N_{B-n}$ of pulses emitted by the TCXO oscillator B during preceding periods and counted by the counter;
    step 4a: comparing the number $N_B$ obtained during the duration T with that of the numbers $N_{B-1}, N_{B-2}, N_{B-3}, \ldots N_{B-n}$, determining a polynomial variation law in order to estimate a correction to be applied to the number $N_B$, to finally obtain a probable average error E for the next period of the rate $R_1$ and storing the probable average error E; and determining a second rate $R_2$ and executing the following steps:

step 1*b*: adding the stored probable average error E to an accumulator at the second rate $R_2$, step 2*b*: when a value of the stored probable average error E in the accumulator, taken as an absolute value, exceeds a predefined maximum value M, then transmitting to a variable-rank divider, having a nominal value K, an overshoot indicator and a sign of the overshoot indicator and executing the following operations:

modifying the nominal value K to K+1 or K−1 depending on a sign of a value of the stored probable average error contained in the accumulator, during a period of the stable-frequency signal Scorr as outputted, subtracting from, or adding to, the accumulator the predefined maximum value M to cancel the overshoot.

9. The method as claimed in claim 8, wherein the second rate $R_2$ is determined based on an acceptable maximum error equal as an absolute value to the predefined maximum value M in the accumulator and of an amplitude of a time correction applied to each overshoot of the accumulator.

\* \* \* \* \*

UNITED STATES PATENT AND TRADEMARK OFFICE
CERTIFICATE OF CORRECTION

PATENT NO. : 8,466,751 B2 Page 1 of 1
APPLICATION NO. : 13/058614
DATED : June 18, 2013
INVENTOR(S) : Jean-Pierre Simondin It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 178 days.

Signed and Sealed this

Eighth Day of September, 2015

Michelle K. Lee
*Director of the United States Patent and Trademark Office*